(12) United States Patent
Takeuchi

(10) Patent No.: US 7,715,514 B2
(45) Date of Patent: *May 11, 2010

(54) CLOCK AND DATA RECOVERY CIRCUIT

(75) Inventor: Masahiro Takeuchi, Kanagawa (JP)

(73) Assignee: NEC Electronics Corporation (JP)

( * ) Notice: Subject to any disclaimer, the term of this patent is extended or adjusted under 35 U.S.C. 154(b) by 1280 days.

This patent is subject to a terminal disclaimer.

(21) Appl. No.: 11/220,611

(22) Filed: Sep. 8, 2005

(65) Prior Publication Data

US 2006/0056564 A1 Mar. 16, 2006

(30) Foreign Application Priority Data

Sep. 10, 2004 (JP) ............... 2004-264232

(51) Int. Cl.
*H03D 3/24* (2006.01)
(52) U.S. Cl. ............ 375/375; 375/360; 375/361; 375/362; 327/160; 327/244
(58) Field of Classification Search ........... 375/334, 375/354, 359–362, 371, 373–376; 327/244, 327/47–48, 151, 160–161, 159
See application file for complete search history.

(56) References Cited

U.S. PATENT DOCUMENTS

| 5,111,160 | A * | 5/1992 | Hershberger | ....... 331/1 A |
| 7,003,066 | B1 * | 2/2006 | Davies et al. | ....... 375/376 |
| 7,061,998 | B1 * | 6/2006 | Rodgers et al. | ....... 375/334 |
| 2004/0223575 | A1 * | 11/2004 | Meltzer et al. | ....... 375/376 |
| 2004/0252804 | A1 * | 12/2004 | Aoyama | ....... 375/376 |

FOREIGN PATENT DOCUMENTS

| JP | 49-31822 | | 8/1974 |
| JP | 49-134255 | | 12/1974 |
| JP | 58-40932 | A | 3/1983 |
| JP | 59-95734 | A | 6/1984 |
| JP | 61-248635 | A | 11/1986 |
| JP | 62-281617 | A | 12/1987 |
| JP | 63-299613 | A | 12/1988 |
| JP | 10-145228 | A | 5/1998 |
| JP | 10-256901 | A | 9/1998 |
| JP | 2000-285605 | A | 10/2000 |
| JP | 2001-273048 | A | 10/2001 |
| JP | 2002-190724 | A | 7/2002 |
| JP | 2005-05999 | A | 1/2005 |
| JP | 4335586 | B2 | 7/2009 |

OTHER PUBLICATIONS

"1.5 Gbps, 5150 ppm Spread Spectrum SerDes PHY with a 0.3 mW, 1.5 Gbps Level Detector for Serial ATA", Symposium on VLSI Circuits Digest of Technical Papers 5-3, Fig. 1, Jun. 2002.

* cited by examiner

*Primary Examiner*—Shuwang Liu
*Assistant Examiner*—James M Perez
(74) *Attorney, Agent, or Firm*—Sughrue Mion, PLLC

(57) ABSTRACT

A clock and data recovery circuit that tracks the frequency and phase fluctuation of serial data includes a feedback controller for monitoring tracking speed of an extraction clock with respect to the frequency and phase fluctuation of the serial data and applying feedback control to an integrator adaptively and moment to moment, thereby raising the tracking speed of the recovered clock and improving the jitter tolerance characteristic.

10 Claims, 10 Drawing Sheets

[Figure 1]
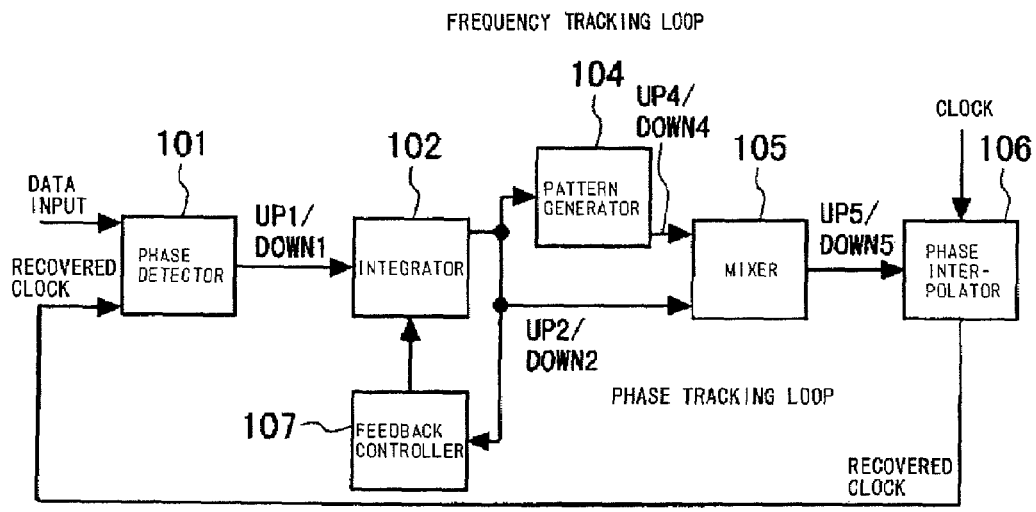
[Figure 2]
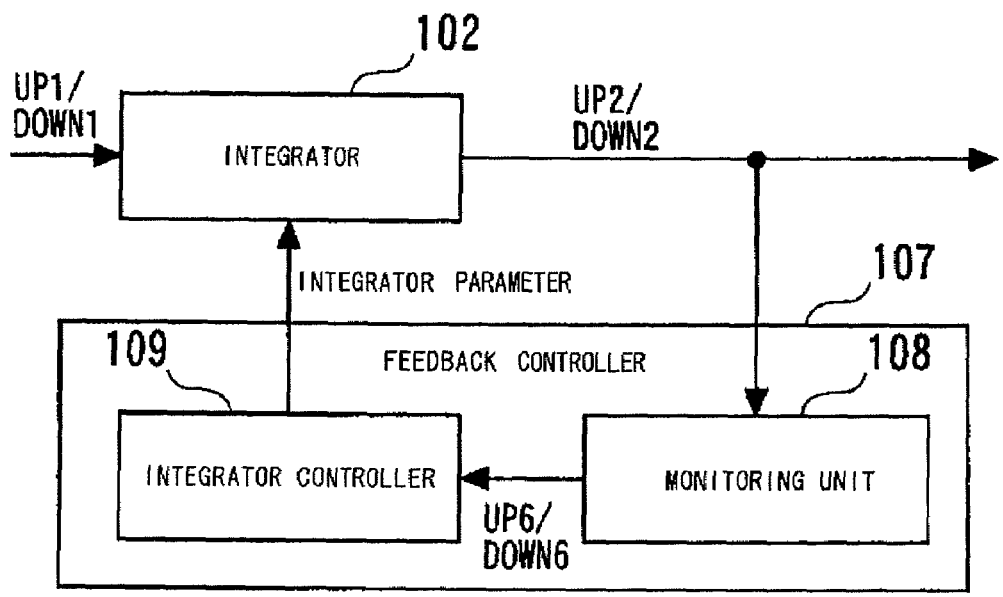

[Figure 5]
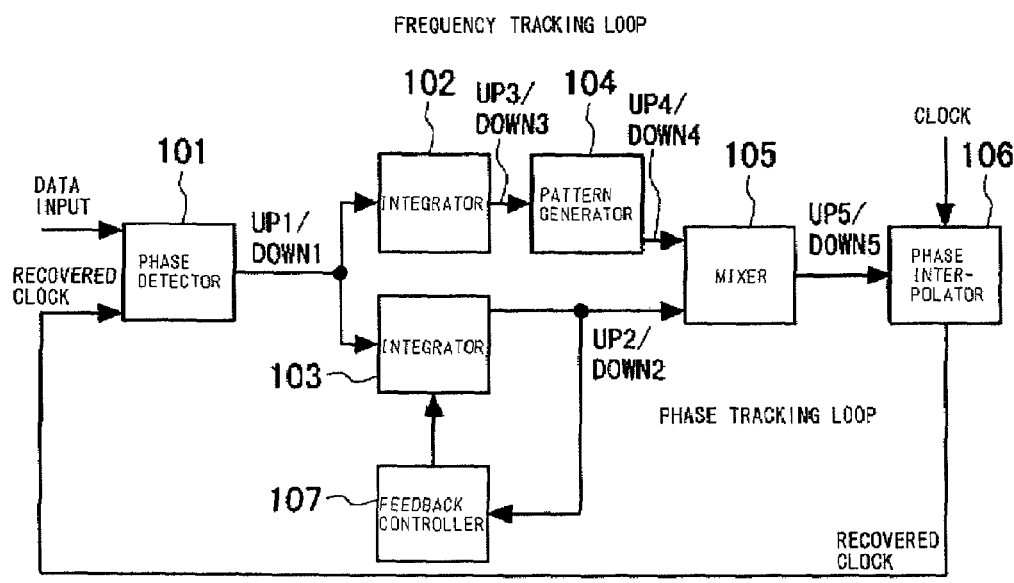
[Figure 6]
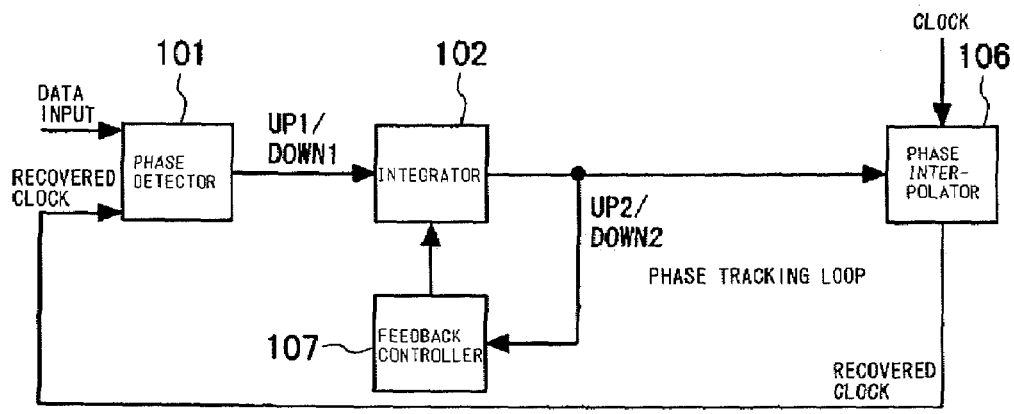

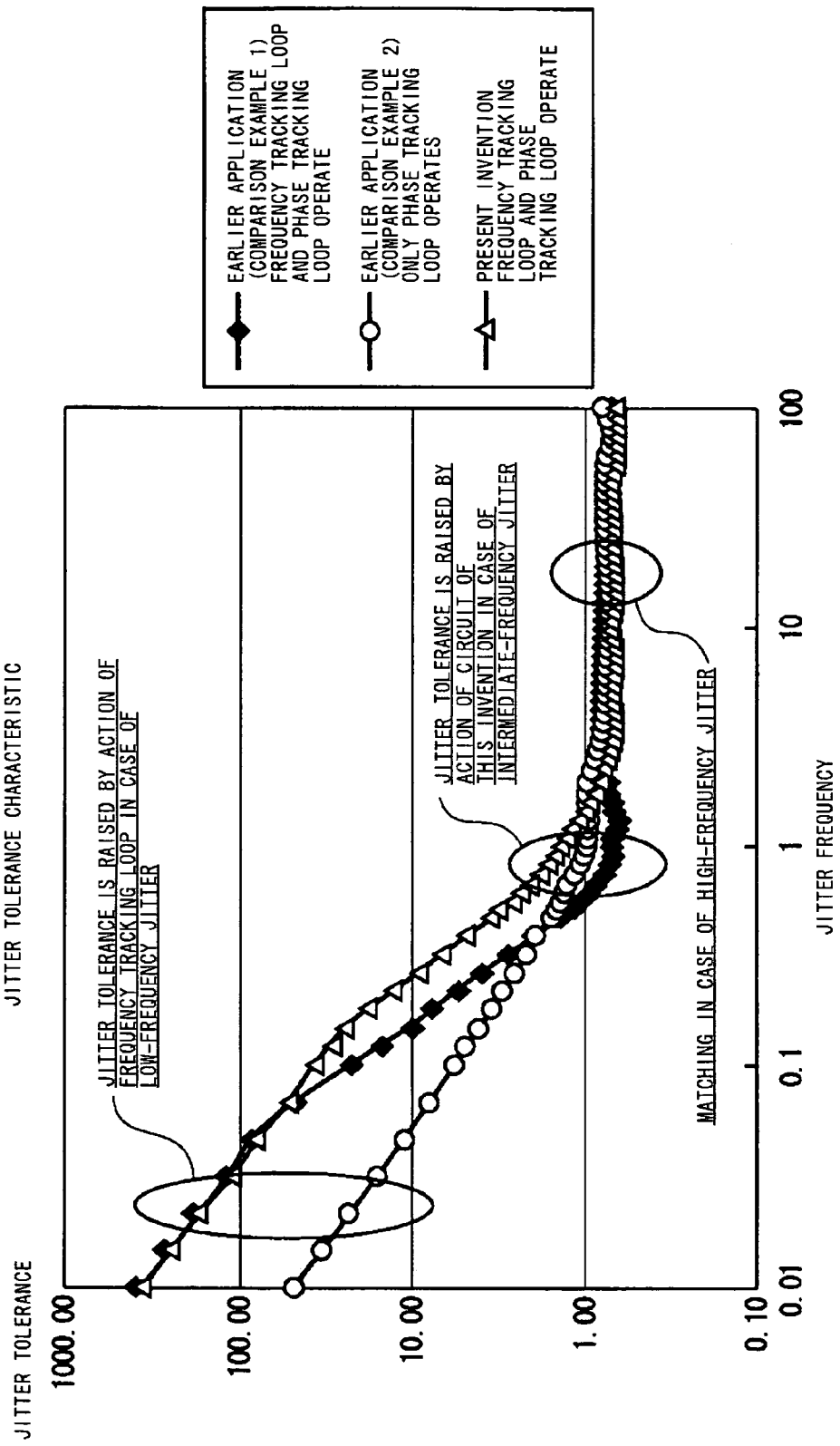

[Figure 10]
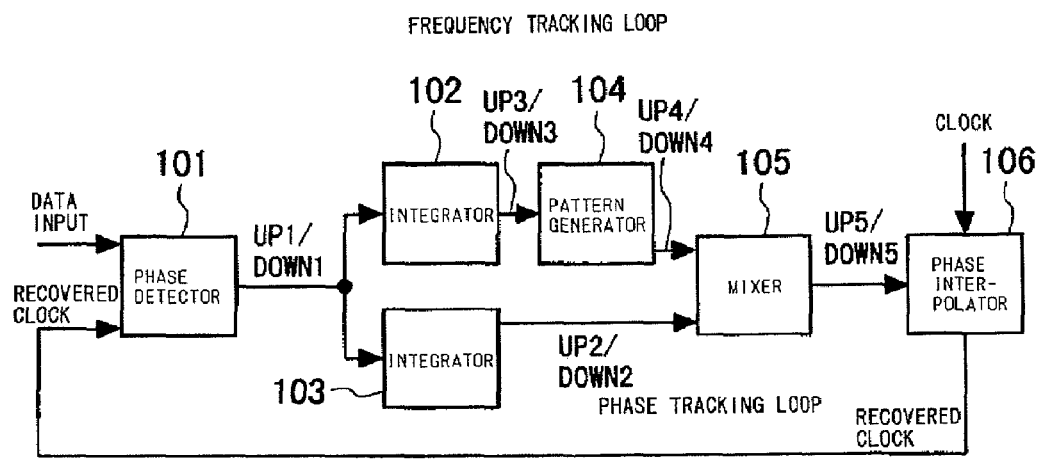
[Figure 11]
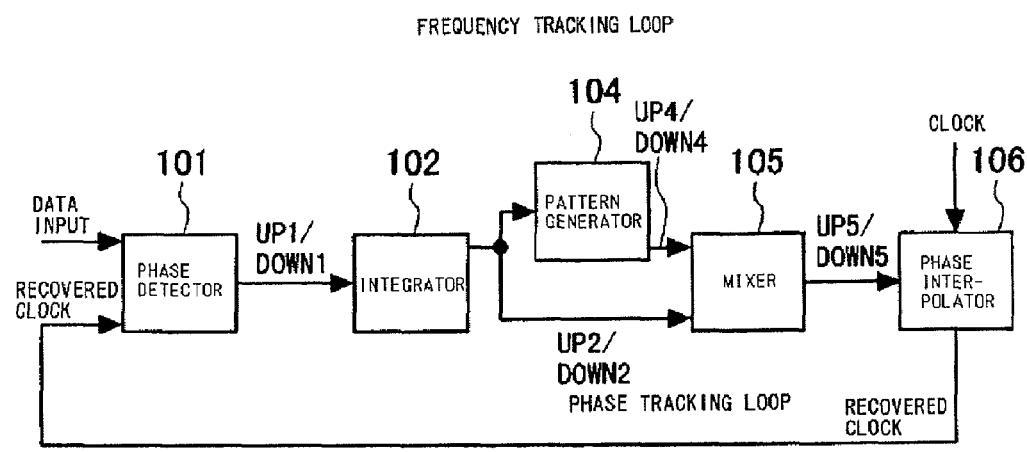

[Figure 12]
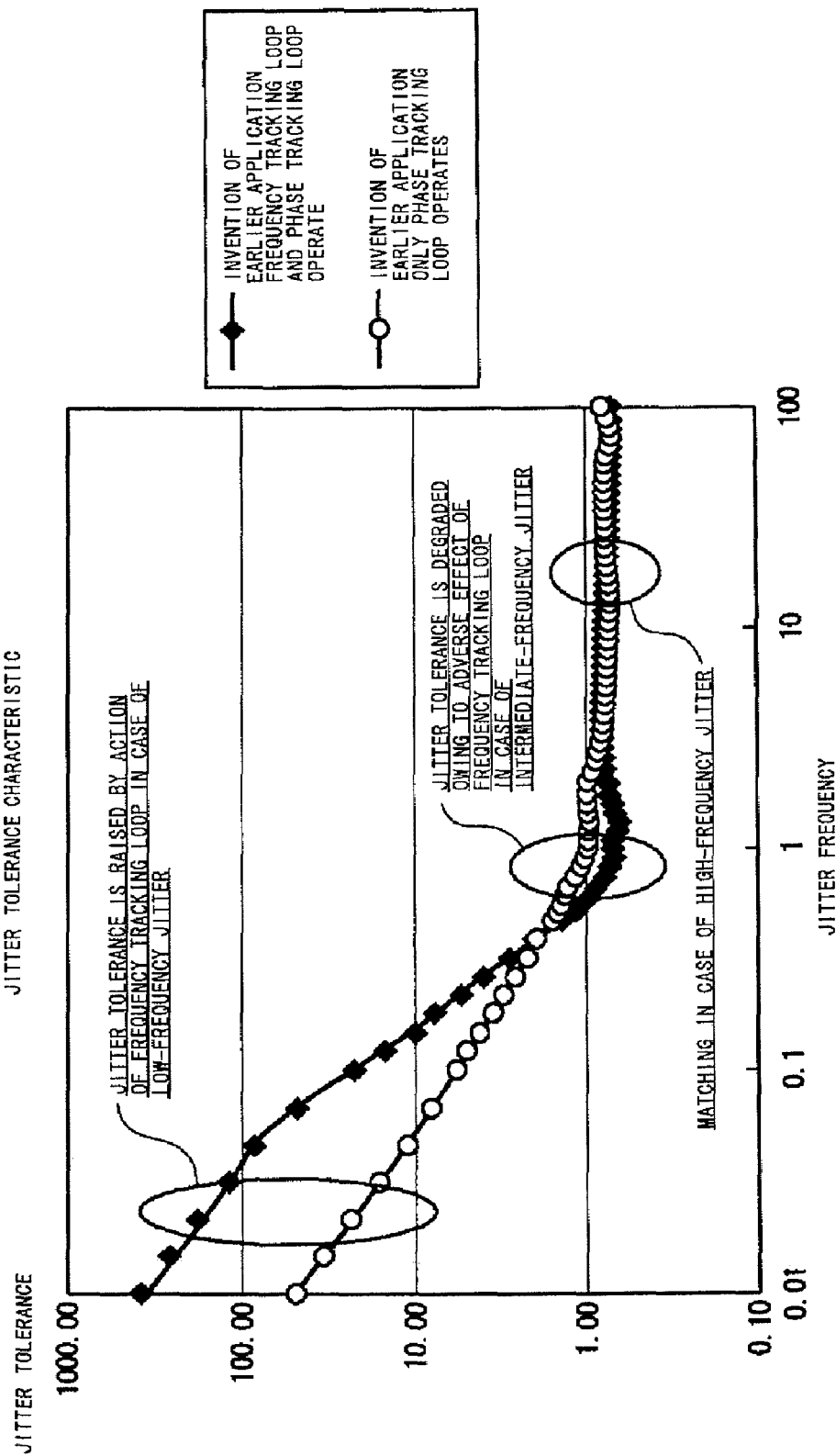

CLOCK AND DATA RECOVERY CIRCUIT

FIELD OF THE INVENTION

This invention relates to a clock and data recovery circuit and, more particularly, to a circuit for controlling tracking speed adaptively in a clock and data recovery circuit, which is mounted on an LSI device on the receiving side, when data is transferred serially between LSI devices.

BACKGROUND OF THE INVENTION

The development of semiconductor technologies in recent years has been accompanied by serialization of data transmission between LSI devices. There are instances where the operating clock frequency of a transmit LSI device and that of a receive LSI device coincide and instances where they do not. One example of a method adopted in a case where these frequencies do not coincide is to reduce EMI (EletroMagnetic Interference) using a spread spectrum clock in which frequency modulation is applied in the transmit LSI device. A method of extracting a clock signal from frequency-modulated serial data in the receive LSI device relies upon a known clock and data recovery circuit of the kind shown in FIG. 13 (see "1.5 Gbps, 5150 ppm Spread Spectrum SerDes PHY with a 0.3 mW, 1.5 Gbps Level Detector for Serial ATA", Symposium on VLSI Circuits Digest of Technical Papers 5-3, FIG. 1, June/2002).

As shown in FIG. 13, the circuit includes a phase tracking loop constituted by a phase detector 201, an integrator 202 and a phase interpolator 206, and a frequency tracking loop constituted by an integrator 203, a charge pump 214, a loop filter 215, a VCO (voltage-controlled oscillator) 216 and the phase interpolator 206. Here a synchronizing clock signal is made to track data that has been frequency-modulated by a spread spectrum clock. Furthermore, in order to initialize the frequency of the VCO 216, the circuit includes a frequency initializing loop constituted by a phase frequency detector 211, the charge pump 212, loop filter 215 and VCO 216.

However, a clock and data recovery circuit having a construction that does not include the integrator 203, charge pump 214, loop filter 215 and VCO 216 constituting the frequency tracking loop in FIG. 13 finds difficulty in tracking the phase of serial data frequency-modulated by a spread spectrum clock. This will be explained below. In a case where the clock and data recovery circuit constructed by the phase detector 201, integrator 202 and phase interpolator 206 is such that the resolution of the phase interpolator 206 is 1/64 and the integrator 202 is constituted by an up-down counter that counts up and down to +4 and −4, tracking can be achieved only to a frequency difference of 1/(64×4)=0.39%. On the other hand, with a serial ATA system, tracking of frequency modulation on the order of, e.g., 0.5% is required.

A clock and data recovery circuit having the frequency tracking loop that includes the charge pump 214, loop filter 215 VCO 216 is capable of being constructed so as to track frequency modulation of 0.5% or greater. In a multichannel implementation, however, chip size and power consumption are great. Specifically, when a clock and data recovery circuit having a frequency tracking loop that includes a charge pump, loop filter and VCO has a multichannel configuration, the frequency tracking loop including the charge pump, loop filter and VCO is provided in all of the channels, resulting in a large chip size. Power consumption increases if a high-speed VCO is provided in all of the channels in a high-speed system of 1 Gbps or higher.

In an attempt to solve these problems, a clock and data recovery circuit of the kind shown for example in FIG. 10 has been proposed by the applicant in an earlier application (Japanese Patent Application No. 2003-166712; Japanese Patent Kokai Publication No. JP2005-005999A).

As shown in FIG. 10, the clock and data recovery circuit proposed in the earlier application (Japanese Patent Application No. 2003-166712; Japanese Patent Kokai Publication No. JP2005-005999A) includes a phase detector 101, integrators 102 and 103, a pattern generator 104, a mixer 105 and a phase interpolator 106. The circuit tracks frequency modulation by the action of a frequency tracking loop constructed by the integrator 102, pattern generator 104 and mixer 105, and tracks slight fluctuations in phase, which cannot be tracked by the frequency tracking loop, by the action of a phase tracking loop constructed by the integrator 103 and mixer 105. The mixer 105 is a circuit that mixes the results from the frequency and phase tracking loops. The mixer controls the phase of the phase interpolator 106, whereby a clock corresponding to serial data is extracted.

FIG. 11 is a diagram illustrating another implementation proposed in the earlier application (Japanese Patent Application No. 2003-166712). In this case, the integrators 102 and 103 of FIG. 10 are replaced by a single shared interpolator 102.

The present inventor has discovered that the characteristics of the clock and data recovery circuit disclosed in the earlier application (Japanese Patent Application No. 2003-166712) can be improved further by improving the jitter tolerance characteristic of a certain frequency band.

The frequency tracking loop exhibits an excellent tracking characteristic with regard to low-frequency jitter but does not respond to high-frequency jitter. The speed of response of the frequency tracking loop is low and there are instances where the phase interpolator 106 is controlled in the wrong direction with regard to jitter in a frequency band approximately midway between the high and low frequencies. In such cases there may be a decline in the jitter tolerance characteristic in a certain frequency band.

FIG. 12 illustrates the results of a simulation of jitter tolerance characteristic in a case where both the frequency tracking loop and phase tracking loop are made to operate and in a case, which is for comparison purposes, where only the phase tracking loop is made to operate. The simulation indicates an excellent jitter tolerance characteristic with respect to low-frequency jitter owing to the action of the frequency tracking loop in a case where both the frequency tracking loop and phase tracking loop are made to operate. Results approximately match with respect to high-frequency jitter. However, with regard to jitter of a frequency that is mid-range between the high and low frequencies, the simulation indicates that the jitter tolerance characteristic is degraded in a case where both the frequency and phase tracking loops are made to operate.

SUMMARY OF THE INVENTION

The foregoing and other objects are attained by a clock and data recovery circuit according to one aspect of the present invention, comprising: a phase detector for detecting a phase relationship between a input clock signal and an input data signal; a frequency tracking loop for tracking frequency modulation based upon a result from the phase detector; a phase tracking loop for tracking phase fluctuation based upon the result from the phase detector; a mixer for mixing results obtained from the frequency tracking loop and phase tracking loop; and a phase interpolator for interpolating a clock phase based upon control from the mixer and generating a recovered clock signal; wherein an integrator for integrating results of phase detection and a feedback controller for performing feedback control with respect to the integrator based upon an output from the integrator are provided in the frequency tracking loop and phase tracking loop.

Further, in the present invention, the integrator and feedback controller in the frequency tracking loop and the integrator and feedback controller in the phase tracking loop may be constituted by a single integrator and a single feedback controller, respectively, shared by both loops.

Further, in the present invention, the frequency tracking loop may be eliminated, in which case the clock and data recovery circuit would comprise only the phase detector, integrator, feedback controller and phase interpolator.

The meritorious effects of the present invention are summarized as follows.

In accordance with the present invention, a frequency tracking loop, a phase tracking loop and a feedback controller, with performs feedback control with respect to an integrator, are provided. As a result, it is possible to provide a clock and data recovery circuit that tracks frequency-modulated data and exhibits an excellent jitter tolerance characteristic. The reason for this is that it is possible to track frequency-modulated data by the action of the frequency tracking loop and to improve the jitter tolerance characteristic by the action of the feedback controller.

In accordance with the present invention, a clock and data recovery circuit exhibiting an excellent jitter tolerance characteristic can be provided by providing a phase tracking loop and a feedback controller that performs feedback control with respect to an integrator. The reason for this is that it is possible to improve the jitter tolerance characteristic by the action of the feedback controller.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 1 is a diagram illustrating the structure of a clock and data recovery circuit according to a first embodiment of the present invention;

FIG. 2 is a diagram illustrating the structure of feedback controller in the clock and data recovery circuit of the first embodiment;

FIG. 5 is a diagram illustrating the structure of a clock and data recovery circuit according to a second embodiment of the present invention;

FIG. 6 is a diagram illustrating the structure of a clock and data recovery circuit according to a third embodiment of the present invention;

FIG. 9 is a graph illustrating the results of a simulation of jitter tolerance characteristics in the case of the present invention and in the case of an example for comparison purposes;

FIG. 10 is a diagram illustrating the structure of a clock and data recovery circuit of an earlier application;

FIG. 11 is a diagram illustrating a second structure of a clock and data recovery circuit of an earlier application;

FIG. 12 is a graph illustrating the results of a simulation of a clock and data recovery circuit of an earlier application.

PREFERRED EMBODIMENTS OF THE INVENTION

Figure 3:
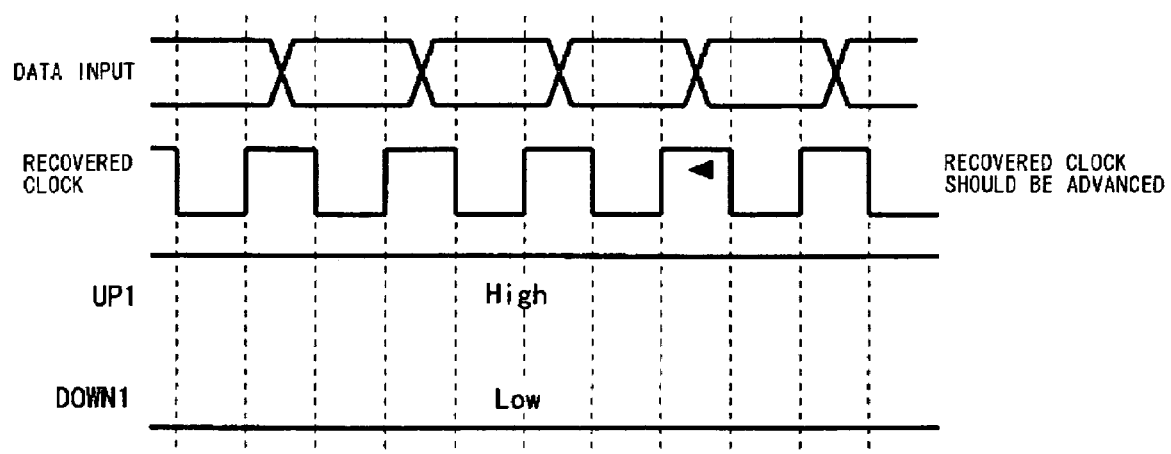
FIGS. 3 and 4 are timing charts illustrating the operation of a phase detector in the clock and data recovery circuit of the first embodiment.

A mode of practicing the present invention will now be described in detail with reference to the drawings. Specifically, the present invention provides a clock and data recovery circuit having a feedback controller for constantly monitoring tracking speed of a recovered clock signal with respect to the frequency and fluctuation in phase of serial data and performing control adaptively with respect to an integrator from moment to moment. By constantly varying a parameter within the integrator, the speed at which the frequency and the fluctuation in phase of serial data are tracked is elevated and the jitter tolerance characteristic is improved. The invention will be described in line with several embodiments.

FIG. 1 is a block diagram illustrating the configuration of a clock and data recovery circuit according to a first embodiment of the present invention. As shown in FIG. 1, the clock and data recovery circuit according to the first embodiment includes the phase detector 101, integrator 102, pattern generator 104, mixer 105, phase interpolator 106 and a feedback controller 107. A frequency tracking loop is constructed by the integrator 102, pattern generator 104, mixer 105 and feedback controller 107, and a phase tracking loop is constructed by the integrator 102, mixer 105 and feedback controller 107. Each of these structural constituents will be described below.

The phase detector 101 detects the phase relationship between the serial data and the recovered clock and judges whether it is better to advance or retard the phase of the recovered clock signal. The phase detector 101 outputs an UP1 or DOWN1 signal as a result of the judgment made.

The integrator 102 performs integration with respect to the UP1 signal and DOWN1 signal. The UP1 signal and DOWN1 signal that are output from the phase detector 101 are signals that are output frequently (i.e., the values of which change frequently). If these signals were to control the phase interpolator 106 as is, the phase of the recovered clock signal would shift frequently. In other words, these signals are not suitable as signals for controlling the phase interpolator 106. Accordingly, the integrator 102 to which the UP1/DOWN1 signal from the phase detector 101 is input performs the function of a low-pass filter and prevents the phase of the recovered clock signal from fluctuating frequently. Specifically, the integrator 102 is implemented by an up/down counter, by way of example.

The output signals of the integrator 102 are an UP2 signal and DOWN2 signal. These signals are the result of detection in the phase tracking loop.

On the basis of the UP2 signal and DOWN2 signal that are output from the integrator 102, the pattern generator 104 detects the frequency difference between the frequency of the serial data and the frequency of the input clock to the phase interpolator 106 and outputs an UP4 signal or a DOWN4 signal at a frequency that is proportional to the size of the frequency difference. The UP4 signal or DOWN4 signal is the result of detection in the frequency tracking loop.

The mixer 105 mixes the UP2 signal and DOWN2 signal that are the result of detection in the phase tracking loop and the UP4 signal and DOWN4 signal that are the result of detection in the frequency tracking loop. As a result, the mixer 105 outputs an UP5 signal and a DOWN5 signal that control the phase interpolator 106.

The phase interpolator 106 advances or retards the phase of the recovered clock signal based upon the UP5 signal and DOWN5 signal from the mixer 105.

In the present embodiment, the internal structures of the phase detector 101, integrator 102, pattern generator 104, mixer 105 and phase interpolator 106 are the same as those set forth in the earlier application (Japanese Patent Application No. 2003-166712).

FIG. 2 is a diagram illustrating an example of the structure of the feedback controller 107 connected to the integrator 102. As shown in FIG. 2, the feedback controller 107 has a monitoring unit 108 and an integrator controller 109.

The monitoring unit 108 monitors the output signals UP2 and DOWN2 from the integrator 102 and outputs an UP6 signal or a DOWN6 signal if it is judged that the parameter of the integrator 102 should be changed. It should be noted that in a case where the integrator 102 is implemented by an up/down counter, the maximum value of the counter is the parameter to undergo control and the maximum value of the counter is varied and controlled.

The integrator controller 109 outputs an integrator parameter signal to the integrator 102 based upon the UP6 signal or DOWN6 signal.

The operation of the clock and data recovery circuit according to the present invention will now be described.

The phase detector 101 detects the phase relationship between the entered serial data and the recovered clock signal from the phase interpolator 106 and judges whether it is better to advance or retard the phase of the recovered clock signal. The phase detector 101 outputs UP1=1 if it judges that the phase of the recovered clock signal should be advanced, and outputs DOWN1=1 if it judges that the phase of the recovered clock signal should be retarded.

Figure 4:
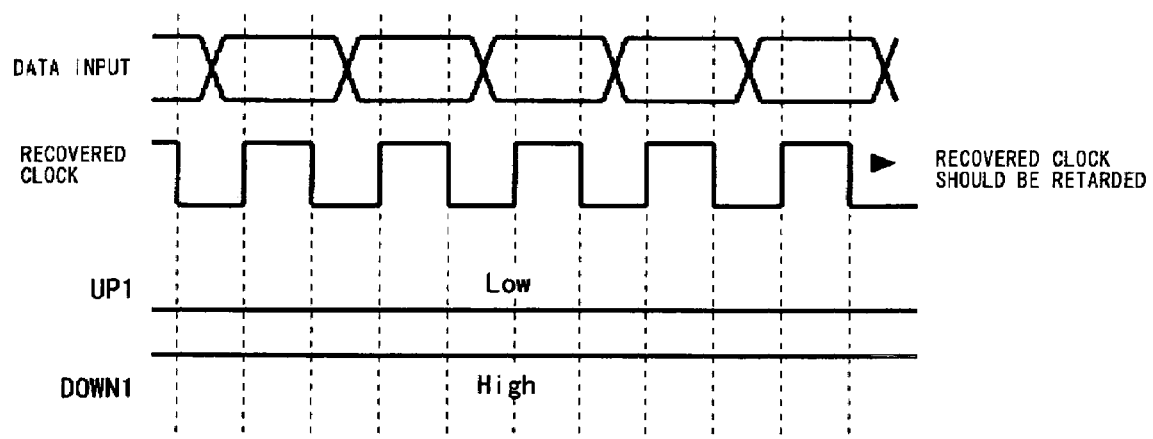

FIG. 3 illustrates the phase relationship between the serial data (the data input) and the recovered clock signal in a case where the phase of the recovered clock signal should be advanced. UP1 is raised to the high level and DOWN 1 lowered to the low level. Further, FIG. 4 illustrates the phase relationship between the serial data and the recovered clock signal in a case where the phase of the recovered clock signal should be retarded. UP1 is lowered to the low level and DOWN1 raised to the high level.

The integrator 102 integrates the UP1 signal and DOWN1 signal and outputs the UP2 signal and the DOWN2 signal. It will be assumed below that the integrator 102 is implemented by an up/down counter.

The integrator 102 counts up if UP1=1 holds and counts down if DOWN1=1 holds. If the absolute value of the counter exceeds a predetermined count, the integrator 102 outputs U2=1 or DOWN2=1 and returns the count to zero.

Based upon the UP2 signal and DOWN2 signal, the pattern generator 104 detects the difference between the frequency of the serial data and the frequency of the input clock to the phase interpolator 106 and outputs UP4=1 or DOWN4=1 at a frequency that is proportional to the size of the frequency difference. The pattern generator 104 outputs UP4=1 if the frequency of the serial data is higher and outputs DOWN4=1 if the frequency of the serial data is lower.

The mixer 105 mixes UP2 and DOWN2 that are the result of detection in the phase tracking loop and UP4 and DOWN4 that are the result of detection in the frequency tracking loop. As a result, the mixer 105 outputs UP5 and DOWN5, which control the phase interpolator 106.

The mixer outputs UP5=1 when the phase of the recovered clock signal is advanced and DOWN5=1 when the phase of the recovered clock signal is retarded.

The phase interpolator 106 advances or retards the phase of the recovered clock signal based upon the UP5 signal and DOWN5 signal.

Based upon the UP6 signal and the DOWN6 signal, the integrator controller 109 outputs the integrator parameter signal (i.e., the number of counts of the integrator) to the integrator 102.

If the number of counts (the integrating time) of the counter (not shown) in the integrator 102 is diminished, the tracking speed of the clock and data recovery circuit will rise. Conversely, if the number of counts of the counter in the integrator 102 is enlarged, the tracking speed of the clock and data recovery circuit can be slowed down.

On the other hand, if the number of counts of the integrator 102 is small, UP2=1 or DOWN2=1 is output frequently and jitter of the recovered clock signal increases. Accordingly, from the standpoint of jitter of the recovered clock signal, it is preferred that the number of counts of the integrator 102 be large rather than small.

The monitoring unit 108 constantly monitors the UP2 signal and the DOWN2 signal. If the result of monitoring is a decision to the effect that the number of counts in the integrator 102 should be updated, then the monitoring unit 108 outputs UP6=1 or DOWN6=1 to the integrator controller 109.

By way of example, in a case where UP2=1 continues or in a case where DOWN2=1 continues, it is very likely that tracking of the recovered clock signal from the phase interpolator 106 will be somewhat slow with respect to the frequency of the serial data and fluctuation in phase. In order to raise the tracking speed of the clock and data recovery circuit, therefore, the monitoring unit 108 outputs DOWN6=1 to lower the number of counts of the counter in integrator 102.

On the other hand, if UP6=1 and DOWN6=1 appear alternatingly, then it is very likely that the tracking speed of the recovered clock signal from the phase interpolator 106 will be optimum with respect to the frequency of the serial data and fluctuation in phase. In order to reduce jitter in the recovered clock signal from the phase interpolator 106, therefore, the monitoring unit 108 outputs UP6=1 to enlarge the number of counts of the counter in integrator 102.

Reference will be had to the drawings to describe another mode of practicing the present invention.

FIG. 5 is a diagram illustrating the structure of a clock and data recovery circuit according to a second embodiment of the present invention. In the first embodiment, only one integrator 102 is used. However, as illustrated in FIG. 5, the integrator may be split into an integrator 102 for the frequency tracking loop and an integrator 103 for the phase tracking loop, and the feedback controller 107 can be appended to the integrator 103 for the phase tracking loop.

Alternatively, only the integrator 102 for the frequency tracking loop a feedback controller can be provided with a feedback controller.

In yet another arrangement, both the integrator 102 for the frequency tracking loop and the integrator 103 for the phase tracking loop can be provided with feedback controllers.

FIG. 6 is a diagram illustrating the structure of a clock and data recovery circuit according to a third embodiment of the present invention. In the first embodiment, two loops, namely the frequency tracking loop and the phase tracking loop, exist. FIG. 6, however, illustrates an arrangement in which the frequency tracking loop has been removed.

First Embodiment

The structure and operation of the best mode for carrying out the present invention will now be described using a specific embodiment.

Figure 7:
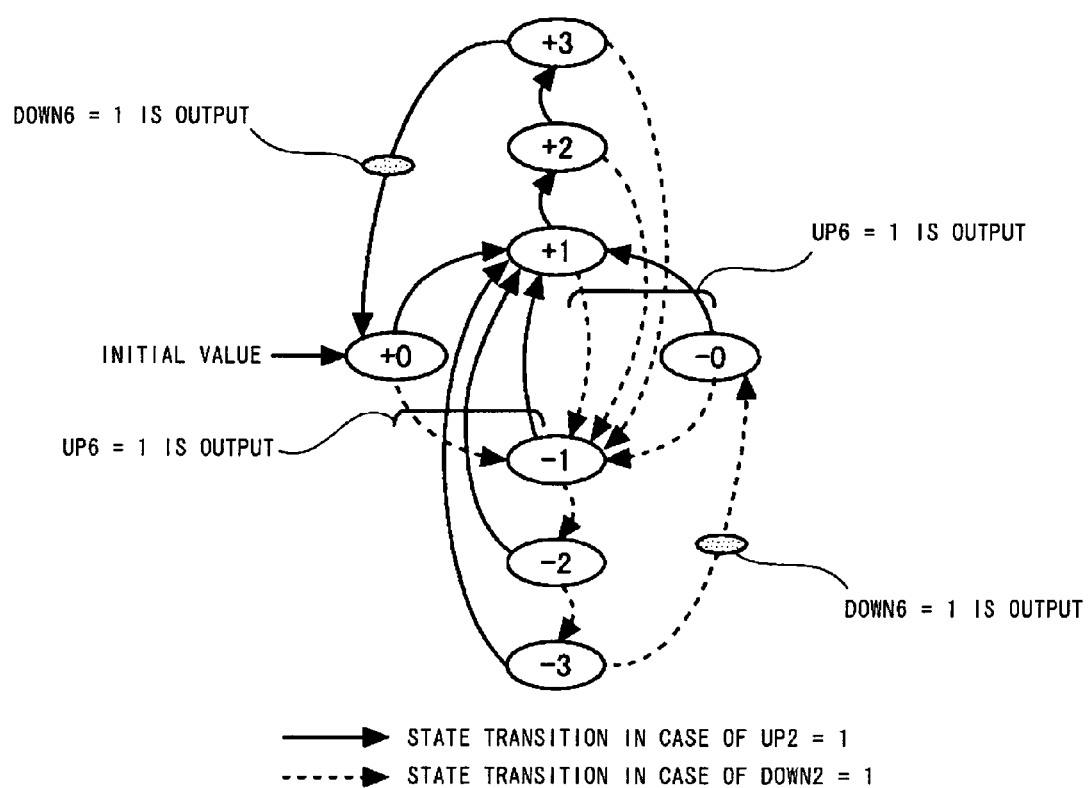
FIG. 7 is a state transition diagram illustrating an example of the operation of a monitoring unit in the clock and data recovery circuit of the first embodiment.
Figure 8:
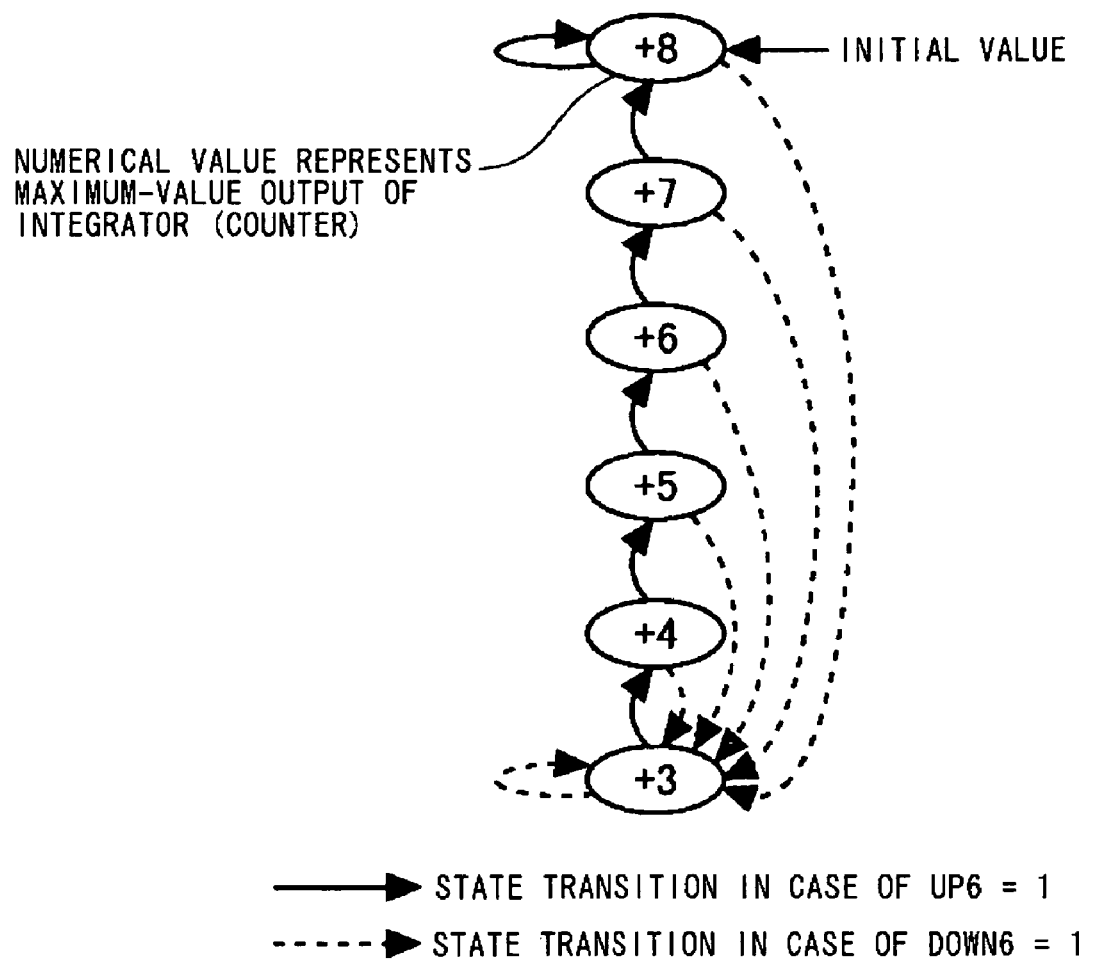
FIG. 8 is a state transition diagram illustrating an example of the operation of an integrator in the clock and data recovery circuit of the first embodiment.
Figure 13:
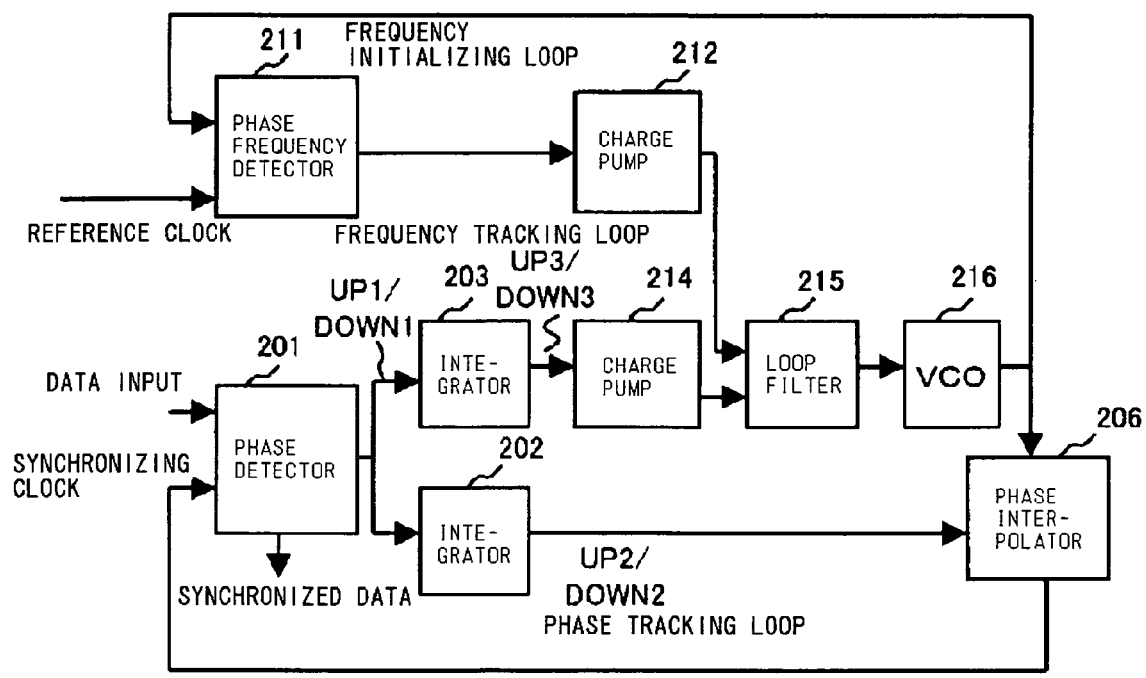
FIG. 13 is a diagram illustrating an example of the structure of a clock and data recovery circuit according to the prior art.

FIG. 7 is a diagram illustrating a transition in the state of the monitoring unit 108 in the feedback controller 107 shown in FIG. 2, and FIG. 8 is a diagram illustrating a transition in the state of the integrator controller 109.

In FIG. 2, the monitoring unit 108 is constituted by a counter, which is not shown. In FIG. 7, numerical values (−3 to +3) within the ovals representing state indicate the values (states) of the counter.

Assume that UP2=1 has been input to the monitoring unit 108. If the value in the counter at this time is equal to or greater than +0 and less than +2, then the value is incremented. If the value of the count is +3, the monitoring unit 108 returns the count to +0 and outputs DOWN6=1. If the value of the count is less than −0, the monitoring unit 108 updates this to +1 and outputs UP6=1.

Assume that DOWN2=1 has been input to the monitoring unit 108. If the value in the counter at this time is less −0 and equal to or greater than −2, then the value is decremented. If the value of the count is −3, the monitoring unit 108 returns the count to −0 and outputs DOWN6=1. If the value of the count is equal to or greater than +0, the monitoring unit 108 updates this to −1 and outputs UP6=1.

By operating in this fashion, the monitoring unit 108 outputs DOWN6=1, thereby reducing the number of counts in the integrator 102, if UP2=1 is output four times in succession or DOWN2=1 is output four times in succession.

In a case where the current output UP2 or DOWN2 is a reversal of the previous output UP2 or DOWN2 (i.e., if UP2=1 was the previous output and DOWN2=1 is the present output, or if DOWN2=1 was the previous output and UP2=1 is the present output), the monitoring unit 108 outputs UP6=1 to thereby enlarge the number of counts in the integrator 102.

The integrator controller 109 of FIG. 2 is constituted by a counter, which is not shown. The numerical values (+3 to +8) within the ovals indicate the values (states) of the counter. It is assumed that the initial value of the counter is +8.

Assume that UP6=1 has been input to the integrator controller 109. If the value in the counter at this time is less than +7, then the value is incremented. If the value of the count is +8, the state of integrator controller 109 is held at +8.

If DOWN6=1 has been input to the integrator controller 109, the counter is updated to +3 regardless of what the value in the counter is at this time.

The value in the counter is constantly being output to the integrator 102 and becomes the maximum value of the counter in the integrator 102.

Thus, owing to operation of the monitoring unit 108 and integrator controller 109 in the manner described above, if UP2 or DOWN2 start being output continuously, the monitoring unit 108 outputs DOWN6=1, the counter in integrator controller 109 is reduced to +3 and the number of counts in the integrator 102 also becomes three.

In a case where the phase of the recovered clock signal lags slightly with respect to fluctuation in the phase of the serial data owing to application of frequency modulation to the serial data, the UP2 signal or DOWN2 signal starts being output continuously.

By reducing the number of counts in the integrator 102 to three in this case, the tracking speed of the clock and data recovery circuit can be raised temporarily.

On the other hand, if UP2 and DOWN2 appear alternatingly after the number of counts in the integrator 102 is made three, the monitoring unit 108 outputs UP6=1, the counter in the integrator controller 109 is incremented gradually from +3 to +8 and the number of counts in the integrator 102 also rises to eight.

When the recovered clock signal is in the vicinity of the optimum phase with respect to the phase of the serial data, UP2 or DOWN2 appears alternatingly. In this case, the number of counts of the integrator 102 returns to eight and the tracking speed of the clock and data recovery circuit also slows down.

Thus, the UP2 signal and DOWN2 signal are monitored at all times by the feedback controller 107 and the number of counts of the integrator 102 is subjected to feedback control adaptively from moment to moment, as a result of which the tracking speed of the clock and data recovery circuit is optimized.

In a case where the tracking speed of the clock and data recovery circuit is somewhat slow, the tracking speed is raised by reducing the number of counts. As a result, it is possible to improve the jitter tolerance characteristic in the intermediate frequency band.

In a case where the tracking speed of the clock and data recovery circuit is satisfactory, the amount of jitter in the recovered clock signal is reduced by enlarging the number of counts.

If the feedback controller 107 is set to react to jitter in the intermediate frequency band, the tracking speed and the resistance to jitter in the intermediate frequency band can be improved. However, if the feedback controller 107 is set to react to low-frequency jitter, then the tracking speed and the resistance to jitter in the low-frequency band can be improved.

FIG. 9 is a diagram illustrating the results of simulating the jitter tolerance characteristic of the clock and data recovery circuit according to the present invention. Also indicated in FIG. 9, as examples for comparison with the present invention, are the results of a simulation of the jitter tolerance characteristic of the clock and data recovery circuit described in the specification of the earlier application (Japanese Patent Application No. 2003-166712; Japanese Patent Kokai Publication No. JP2005-005999A).

In Comparison Example 1 (indicated by the black diamond-shaped symbols), the frequency tracking loop and phase tracking loop were made to operate in the invention of the earlier application. In Comparison Example 2 (indicated by the white circles), only the phase tracking loop was made to operate in the invention of the earlier application. As shown in FIG. 9, it will be understood that the clock and data recovery circuit of the present invention (indicated by the white triangles) has a jitter tolerance characteristic that is improved over those of Comparison Examples 1 and 2.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A clock and data recovery circuit, receiving input serial data and an input clock signal for recovering a clock signal, said clock and data recovery circuit comprising:
   a phase detector, receiving the input serial data and the recovered clock signal as input signals, for comparing phases of the received input signals;
   a frequency tracking loop for tracking frequency modulation of the input serial data; said frequency tracking loop including a first integrator for integrating result of comparison from said phase detector and a pattern generator;
   a phase tracking loop for tracking phase fluctuation of the input serial data; said phase tracking loop including a second integrator for integrating result of comparison from said phase detector; and
   a feedback control circuit for feedback-controlling one or both of said first and second integrators;
   a phase interpolator, receiving said input clock signal and a control signal and generating the recovered clock signal for output, said phase interpolator variably adjusting the phase of said recovered clock signal;
   said phase detector comparing the phase of the input data signal and the phase of the recovered clock signal output from said phase interpolator;
   said pattern generator provided in said frequency tracking loop receiving an integrated value of result of phase comparison from said phase detector, for generating and outputting a signal that is for variably setting the phase of the recovered clock signal from said phase interpolator; and
   a mixer for generating a signal that is the result of mixing the integrated value in the phase tracking loop, which controls the phase of the recovered clock signal from said phase interpolator in accordance with the integrated value of the result of phase comparison by said phase detector, and the output of said pattern generator in the frequency tracking loop;
   wherein the signal generated by said mixer is supplied to said phase interpolator as the control signal;
   wherein said first integrator and second integrator are formed by a common integrator shared by said frequency tracking loop and said phase tracking loop, or said first integrator and second integrator separate integrators are provided in said frequency tracking loop and said phase tracking loop respectively; and
   wherein said feedback control circuit, monitoring an output from said integrator and variably controlling a parameter of at least one of said integrators based upon result of monitoring, is connected to said common integrator shared by said frequency tracking loop and said phase tracking loop, or is connected to at least one of said first and second integrators provided separately for respective ones of the phase tracking loop and frequency tracking loop.

2. The clock and data recovery circuit according to claim 1, wherein when one loop out of the phase tracking loop and the frequency tracking loop indicates that said one loop is in a stable state, said mixer outputs the control signal, which is for adjusting the phase of the recovered clock signal in said phase interpolator, based upon result of the phase comparison in the other loop.

3. The clock and data recovery circuit according to claim 1, wherein said mixer outputs a control signal, which advances the phase of the recovered clock signal of said phase interpolator, continuously for a prescribed number of clocks if both the result of phase comparison in the frequency tracking loop and the output of said pattern generator in the frequency tracking loop indicate UP, and outputs a control signal, which retards the phase of the recovered clock signal of said phase interpolator, continuously for a prescribed number of clocks if both the result of phase comparison in the phase tracking loop and the output of said pattern generator in the frequency tracking loop indicate DOWN.

4. The clock and data recovery circuit according to claim 1, wherein said integrator comprises a counter, and a parameter of said integrator is number of counts of said counter.

5. The circuit according to claim 4, wherein in a case where said integrator continuously outputs a control signal that retards or advances the phase of one of said two signals input to said phase detector, said feedback controller reduces the number of counts of said counter.

6. The circuit according to claim 4, wherein in a case where said integrator alternately outputs a control signal that retards or advances the phase of one of said two signals input to said phase detector, said feedback controller enlarges the number of counts of said counter.

7. A clock and data recovery circuit, receiving input serial data and an input clock signal for recovering a clock signal, said clock and data recovery circuit comprising:
   a phase detector, receiving the input serial data and the recovered clock signal as input signals, for comparing phases of the received input signals;
   a frequency tracking loop for tracking frequency modulation of the input serial data; a phase tracking loop for tracking phase fluctuation of the input serial data, said frequency tracking loop including a pattern generator;
   said frequency tracking loop and said phase tracking loop sharing an integrator for integrating result of comparison from said phase detector; and
   a feedback control circuit for feedback-controlling said integrator
   a phase interpolator, receiving said input clock signal and a control signal and generating the recovered clock signal for output, said phase interpolator variably adjusting the phase of the recovered clock signal;
   said phase detector, receiving said input data signal and the recovered clock signal from said phase interpolator as input signals, for comparing phases of the received two input signals, detecting lead or lag and outputting a first control signal in accordance with result of detection;
   said integrator, receiving the first control signal output from said phase detector, for integrating the received first control signal and outputting a second control signal;
   said pattern generator receiving the second control signal from said integrator, for counting the second control signal, detecting, based upon result of counting, a frequency difference between frequency of the data signal and frequency of the input clock signal to said phase interpolator, and outputting a third control signal; and
   a mixer, receiving the second control signal from said integrator and the third control signal from said pattern generator, for generating a fourth control signal based upon the second and third control signals, and supplying the fourth control signal to said phase interpolator as said control signal;

said feedback control circuit monitoring an output of said integrator and variably controlling a parameter of said integrator based upon result of monitoring.

8. The clock and data recovery circuit according to claim 7, wherein said integrator comprises a counter, and a parameter of said integrator is number of counts of said counter.

9. A clock and data recovery circuit, receiving input serial data and an input clock signal for recovering a clock signal, said clock and data recovery circuit comprising:

a phase detector, receiving the input serial data and the recovered clock signal as input signals, for comparing phases of the received input signals;

a frequency tracking loop for tracking frequency modulation of the input serial data; said frequency tracking loop including a first integrator for integrating result of comparison from said phase detector and a pattern generator;

a phase tracking loop for tracking phase fluctuation of the input serial data; said phase tracking loop including a second integrator for integrating result of comparison from said phase detector; and a feedback control circuit for feedback-controlling one or both of said first and second integrators;

a phase interpolator, receiving the input clock signal and a control signal and generating the recovered clock signal for output, said phase interpolator variably adjusting the phase of the recovered clock signal;

said phase detector, receiving the input data signal and the recovered clock signal from said phase interpolator as input signals, for comparing phases of the received two input signals, detecting lead or lag and outputting a first control signal in accordance with result of detection;

said first integrator, receiving the first control signal output from said phase detector, for integrating the received first control signal and outputting a second control signal;

said second integrator, receiving the first control signal output from said phase detector, for integrating the received first control signal and outputting a third control signal;

said pattern generator, receiving the third control signal from said second integrator, for counting the third control signal, detecting, based upon result of counting, a frequency difference between frequency of the data signal and frequency of the input clock signal to said phase interpolator, and outputting a fourth control signal; and a mixer, receiving the second control signal from said first integrator and the fourth control signal from said pattern generator, for generating a fifth control signal based upon the second and fourth control signals, and supplying the fifth control signal to said phase interpolator as said control signal;

said feedback control circuit monitoring an output of at least one of said first and second interpolators and variably controlling a parameter of said integrator based upon result of monitoring.

10. The clock and data recovery circuit according to claim 9, wherein said integrator comprises a counter, and a parameter of said integrator is number of counts of said counter.

* * * * *